(12) United States Patent
Joshi et al.

(10) Patent No.: US 7,544,625 B2
(45) Date of Patent: Jun. 9, 2009

(54) SILICON OXIDE THIN-FILMS WITH EMBEDDED NANOCRYSTALLINE SILICON

(75) Inventors: Pooran Chandra Joshi, Vancouver, WA (US); Tingkai Li, Vancouver, WA (US); Yoshi Ono, Camas, WA (US); Apostolos T. Voutsas, Portland, OR (US); John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 442 days.

(21) Appl. No.: 11/418,273

(22) Filed: May 4, 2006

(65) Prior Publication Data

US 2006/0211267 A1    Sep. 21, 2006

Related U.S. Application Data (63) Continuation-in-part of application No. 11/327,612, filed on Jan. 6, 2006, and a continuation-in-part of application No. 11/139,726, filed on May 26, 2005, now Pat. No. 7,381,595, and a continuation-in-part of application No. 11/013,605, filed on Dec. 15, 2004, and a continuation-in-part of application No. 10/871,939, filed on Jun. 17, 2004, now Pat. No. 7,186,663, and a continuation-in-part of application No. 10/801,377, filed on Mar. 15, 2004, now Pat. No. 7,122,487, and a continuation-in-part of application No. 10/801,374, filed on Mar. 15, 2004, now Pat. No. 7,087,537.

(51) Int. Cl.
    *H01L 21/31* (2006.01)
(52) U.S. Cl. ............ 438/778; 438/569; 438/584; 438/637; 438/689; 438/788; 257/E21.252; 257/E21.279
(58) Field of Classification Search .......... 438/569
     See application file for complete search history.

(56) References Cited

U.S. PATENT DOCUMENTS 6,184,158 B1 *  2/2001  Shufflebotham et al. .... 438/788

(Continued)

OTHER PUBLICATIONS

"High efficiency light emission devices in Si", Castagna et al, Mat. Res. Soc. Symp. Proc., vol. 770, p. 12.1.1 (2003).

*Primary Examiner*—N Drew Richards
*Assistant Examiner*—Kyoung Lee
(74) *Attorney, Agent, or Firm*—Law Office of Gerald Maliszewski; Gerald Maliszewski (57) ABSTRACT

A method is provided for forming a silicon oxide (SiOx) thin-film with embedded nanocrystalline silicon (Si). The method deposits SiOx, where x is in the range of 1 to 2, overlying a substrate, using a high-density (HD) plasma-enhanced chemical vapor deposition (PECVD) process. As a result, the SiOx thin-film is embedded with nanocrystalline Si. The HD PECVD process may use an inductively coupled plasma (ICP) source, a substrate temperature of less than about 400° C., and an oxygen source gas with a silicon precursor. In one aspect, a hydrogen source gas and an inert gas are used, where the ratio of oxygen source gas to inert gas is in the range of about 0.02 to 5. The SiOx thin-film with embedded nanocrystalline Si typically has a refractive index in the range of about 1.6 to 2.2, with an extinction coefficient in the range of 0 to 0.5.

34 Claims, 6 Drawing Sheets

U.S. PATENT DOCUMENTS 6,483,861 B2    11/2002  Moon .................... 372/45.01
6,710,366 B1    3/2004   Lee et al. .................... 257/14

2004/0106285 A1*  6/2004  Zacharias .................... 438/689

* cited by examiner

SILICON OXIDE THIN-FILMS WITH EMBEDDED NANOCRYSTALLINE SILICON

RELATED APPLICATIONS

This application is a continuation-in-part of a pending patent application entitled, ENHANCED THIN-FILM OXIDATION PROCESS, invented by Pooran Joshi et al., Ser. No. 11/327,612, filed Jan. 6, 2006.

This application is a continuation-in-part of a pending patent application entitled, HIGH-DENSITY PLASMA HYDROGENATION, invented by Pooran Joshi et al., Ser. No. 11/013,605, filed Dec. 15, 2004.

This application is a continuation-in-part of a pending patent application entitled, DEPOSITION OXIDE WITH IMPROVED OXYGEN BONDING, invented by Pooran Joshi, Ser. No. 10/801,377, filed Mar. 15, 2004 now U.S. Pat. No. 7,122,487.

This application is a continuation-in-part of a pending patent application entitled, HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595.

This application is a continuation-in-part of a pending patent application entitled, HIGH-DENSITY PLASMA PROCESS FOR SILICON THIN-FILMS, invented by Pooran Joshi, Ser. No. 10/871,939, filed Jun. 17, 2004 now U.S. Pat. No. 7,186,663.

This application is a continuation-in-part of a pending patent application entitled, METHOD FOR FABRICATING OXIDE THIN-FILMS, invented by Joshi et al., Ser. No. 10/801,374, filed Mar. 15, 2004 now U.S. Pat. No. 7,087,537.

All of the above-mentioned applications are incorporated herein by reference.

BACKGROUND OF THE INVENTION

1. Field of the Invention

This invention generally relates to the fabrication of integrated circuit (IC) devices, and more particularly, to a method for forming a silicon oxide film with embedded nanocrystalline Si, using a high-density plasma-enhanced chemical vapor deposition process.

2. Description of the Related Art

The unique structural, electrical, and optical properties of nanocrystalline silicon (Si) have attracted interest for their use in optoelectronic and integrated memory devices. Silicon is the material of choice for the fabrication of optoelectronic devices because of well-developed processing technology. However, the indirect band-gap makes it an inefficient material for optoelectronic devices. Over the years, various R&D efforts have focused on tailoring the optical function of Si to realize Si-based optoelectronics. The achievement of efficient room temperature light emission from the crystalline silicon is a major step towards the achievement of fully Si-based optoelectronics.

The fabrication of stable and reliable optoelectronic devices requires Si nanocrystals with high photoluminescence (PL) and electroluminescence (EL) quantum efficiency. One approach that is being actively pursued for integrated optoelectronic devices is the fabrication of $SiO_x$ ($x \leq 2$) thin films with embedded Si nanocrystals. The luminescence due to recombination of the electron-hole pairs confined in Si nanocrystals depends strongly on the nanocrystal size. The electrical and optical properties of the nanocrystalline Si embedded $SiO_x$ thin films depend on the size, concentration, and distribution of the Si nanocrystals. Various thin-film deposition techniques such as sputtering and plasma-enhanced chemical vapor deposition (PECVD), employing capacitively-coupled plasma source, are being investigated for the fabrication of stable and reliable nanocrystalline Si thin films.

However, conventional PECVD and sputtering techniques have the limitations of low plasma density, inefficient power coupling to the plasma, low ion/neutral ratio, and uncontrolled bulk, and interface damage due to high ion bombardment energy. Therefore, the oxide films formed from a conventional capacitively-coupled plasma (CCP) generated plasma may create reliability issues due to the high bombardment energy of the impinging ionic species. It is important to control or minimize any plasma-induced bulk or interface damage. However, it is not possible to control the ion energy using radio frequency (RF) of CCP generated plasma. Any attempt to enhance the reaction kinetics by increasing the applied power results in increased bombardment of the deposited film, which creates a poor quality films with a high defect concentration. Additionally, the low plasma density associated with these types of sources ($\sim 1 \times 10^8$-$10^9$ cm$^{-3}$) leads to limited reaction possibilities in the plasma and on the film surface, inefficient generation of active radicals for enhanced process kinetics, inefficient oxidation, and reduction of impurities at low thermal budgets, which limits their usefulness in the fabrication of low-temperature electronic devices.

A deposition process that offers a more extended processing range and enhanced plasma characteristics than conventional plasma-based techniques, such as sputtering, PECVD, etc., is required to generate and control the particle size for PL/EL based device development. A process that can enhance plasma density and minimize plasma bombardment will ensure the growth of high quality films without plasma-induced microstructural damage. A process that can offer the possibility of controlling the interface and bulk quality of the films independently will enable the fabrication of high performance and high reliability electronic devices. A plasma process that can efficiently generate the active plasma species, radicals and ions, will enable noble thin film development with controlled process and property control.

For the fabrication of high quality SiOx thin films, the oxidation of the growing film is also critical to ensure high quality insulating layer across the nanocrystalline Si particles. A process that can generate active oxygen radicals at high concentration will ensure effective passivation of the Si nanoparticles in the oxide matrix surrounding it. A plasma process that can minimize plasma-induced damage will enable the formation of a high quality interface that is critical for the fabrication of high quality devices. Low thermal budget efficient oxidation and hydrogenation processes are critical and will be significant for the processing of high quality optoelectronic devices. The higher temperature thermal processes can interfere with the other device layers and it is not suitable in terms of efficiency and thermal budget, due to the lower reactivity of the thermally activated species. Additionally, a plasma process which can provide a more complete solution and capability in terms of growth/deposition of novel film structures, oxidation, hydrogenation, particle size creation and control, and independent control of plasma density and ion energy, and large area processing is desired for the development of high performance optoelectronic devices. Also, it is important to correlate the plasma process with the thin film properties as the various plasma parameters dictate the thin film properties and the desired film quality depends on the target application. Some of the key plasma and thin-film characteristics that depend on the target application are deposition rate, temperature, thermal budget, density, microstructure, interface quality, impurities, plasma-induced damage, state of the plasma generated active species (radicals/ ions), plasma potential, process and system scaling, and electrical quality and reliability. A correlation among these parameters is critical to evaluate the film quality as the process map will dictate the film quality for the target application. It may not be possible to learn or develop thin-films by just extending the processes developed in low density plasma or other high density plasma systems, as the plasma energy, composition (radical to ions), plasma potential, electron temperature, and thermal conditions correlate differently depending on the process map.

Low temperatures are generally desirable in liquid crystal display (LCD) manufacture, where large-scale devices are formed on transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

It would be advantageous if a low-temperature process existed for the fabrication of SiOx thin-films, with embedded Si nanocrystals, having high-quality Si substrate interfacial qualities.

SUMMARY OF THE INVENTION

This invention describes a novel high-density plasma-based processes for the fabrication of nanocrystalline Si-embedded $SiO_x$ thin films with controlled microstructural, optical, and electrical properties. The high-density plasma technique is characterized by high plasma concentrations, low plasma potential, and independent control of plasma energy and density, which provide unique process possibilities and control. The high-density plasma characteristics are suitable for novel thin-film fabrication due to enhanced plasma reaction kinetics. The high-density plasma deposition process is dominantly controlled by the plasma characteristics rather than the thermal state of the substrate. The high plasma density and low plasma potential of the high-density plasma process are attractive for the creation of the Si nanocrystals, while minimizing the plasma induced bulk and interface damage.

The high-density plasma deposited $SiO_x$ films generate PL signals even in the as-deposited state, while the subsequent annealing results in a significant enhancement of the PL intensity. The high temperature treatment results in a separation of the $SiO_x$ phase into Si clusters or nanocrystals separated by a matrix of $SiO_2$. It is important to control the nanocrystal size, concentration, and distribution in the as-deposited films so that the emission and electrical characteristics of the films after annealing can be exploited for the fabrication of efficient PL/EL and memory devices. The high-density plasma process is suitable for the fabrication of single layer, bilayer, or multilayer structures for optoelectronic applications by sequential processing, either in-situ or using a cluster tool.

Accordingly, a method is provided for forming a silicon oxide (SiOx) thin-film with embedded nanocrystalline silicon (Si). The method deposits SiOx, where x is in the range of 1 to 2, overlying a substrate, using a high-density (HD) plasma-enhanced chemical vapor deposition (PECVD) process. As a result, a SiOx thin-film is formed, embedded with nanocrystalline Si. Typically, the HD PECVD process uses an inductively coupled plasma (ICP) source, a substrate temperature of less than about 400° C., and an oxygen source gas with a silicon precursor. In one aspect, the method also uses a hydrogen source gas. In another aspect, the method may use the oxygen source gas, silicon precursor, hydrogen gas, and an inert gas, where the ratio of oxygen source gas to inert gas is in the range of about 0.02 to 5.

The SiOx thin-film with embedded nanocrystalline Si typically has a refractive index in the range of about 1.6 to 2.2. The refractive index of the SiOx thin-film can be increased in response to increasing the ratio of hydrogen to silicon precursor. If the oxygen source gas and silicon precursor are mixed with a noble gas, where the ratio of noble gas to silicon precursor in the range of about 0.02 to 10, then the refractive index of the SiOx thin film can be increased in response to increasing the ratio of noble gas to silicon precursor. The refractive index of the SiOx thin-film can also be increased by decreasing the RF power to the top electrode, or by increasing the ratio of silicon precursor to oxygen source gas.

In another aspect following the formation of the SiOx thin-film, an annealing process can be performed to modify the size of nanocrystalline Si particles in the SiOx thin-film. For example, a heat source can be used that has a radiation wavelength of about 200 to 600 nanometers (nm) or 9 to 11 micrometers. The Si particles can also be modified using a post-deposition plasma or thermal annealing/oxidation process. In a different aspect, a HD plasma treatment is performed in an $H_2$ atmosphere, using a substrate temperature of less than 400° C., to hydrogenate the SiOx thin-film.

Additional details of the above-described method are presented below.

DETAILED DESCRIPTION

High-Density Plasma System

Figure 1:
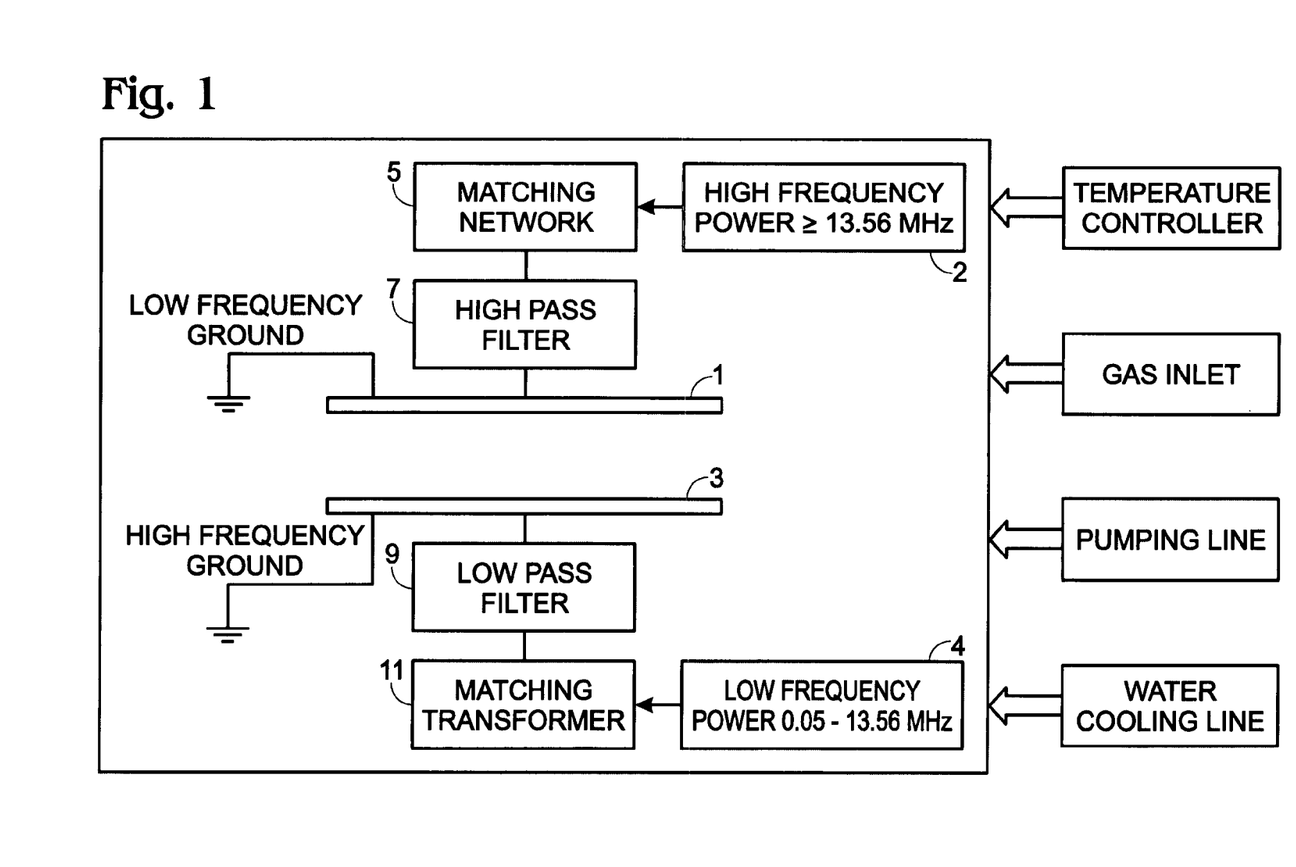
FIG. 1 is a schematic drawing of a high-density plasma (HDP) system with an inductively-coupled plasma source.

FIG. 1 is a schematic drawing of a high-density plasma (HDP) system with an inductively coupled plasma source. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1.

The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter (W/cm$^2$), while the bottom electrode power can be as great as about 3 W/cm$^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high density plasma process with an electron concentration of greater than $1 \times 10^{11}$ cm$^{-3}$, and the electron temperature is less than 10 eV. There is no need to maintain a bias differential between the capacitor connected to the top electrode and the system body, as in many high density plasma systems and conventional designs such as capacitively-coupled plasma tools. Alternately stated, both the top and bottom electrodes receive RF and low frequency (LF) powers.

High-Density Plasma-Enhanced Chemical Vapor Deposition

The present invention describes a high-density PECVD technique for the processing of nanocrystalline silicon embedded SiO$_x$ thin films. The high-density plasma process offers the unique advantages of high plasma energy, low plasma potential, and independent control of plasma energy and density for novel thin film processing. The high-density plasma offers unique process possibilities due to the enhanced reaction kinetics in the bulk of the plasma, and on the substrate surface. The low plasma potential minimizes any plasma-induced damage to the bulk microstructure and the film/substrate interface. The high-density PECVD technique offers the possibility of forming nanocrystalline Si particles in the as-deposited films at high concentration and with particle sizes suitable for PL emission in the visible range. The HD-PECVD process can be efficiently tuned to vary the particle size over a wide range, to control the wavelength of the emitted PL signal. Additionally, the HD-PECVD technique is suitable for the fabrication of superlattice structures with high quality Si and SiO$_x$ thin-films by sequential processing or using a cluster tool to minimize any chamber contamination.

The high-density plasma technique is attractive for processing high quality Si (amorphous, microcrystalline, polycrystalline, or nanocrystalline), SiO$_2$, and SiO$_x$ thin-films for the fabrication of stable and reliable optoelectronic devices. The high-density plasma-based processes enables the fabrication of high-quality single and multi-layer superlattice structures suitable for the fabrication of efficient and reliable optoelectronic devices. The fabrication of electroluminescent devices based on photo-emission characteristics of nanocrystalline Si will dictate the development of high performance and cost-effective integrated optoelectronic devices. Another potential application of the SiO$_x$ thin films is the flash memory.

Figures 2, 3:
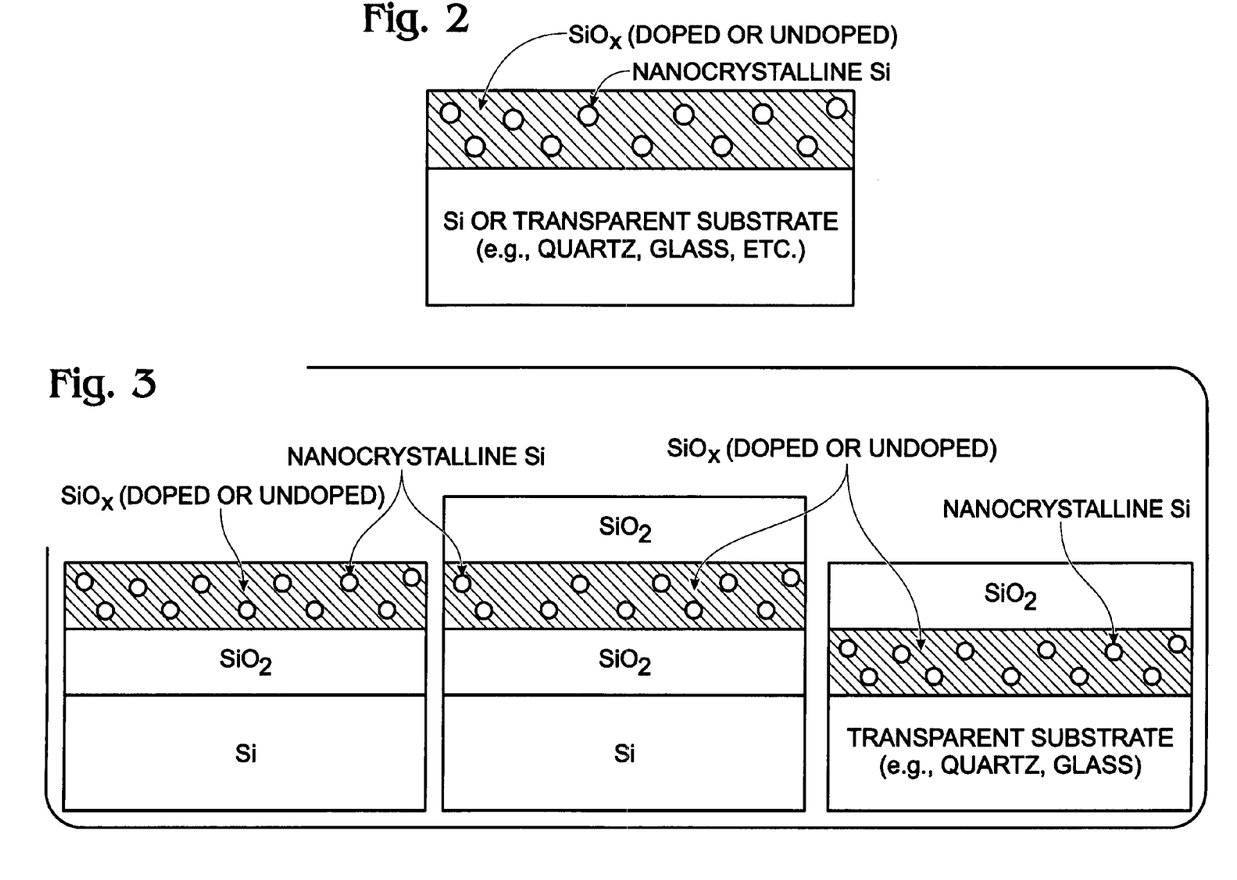
FIGS. 2 and 3 are partial cross-sectional views depicting nanocrystalline Si-based PL/EL devices.

FIGS. 2 and 3 are partial cross-sectional views depicting nanocrystalline Si-based PL/EL devices. The various layers can be processed by high-density plasma-based processes at temperatures suitable for device integration on various types of substrates. The high-density PECVD technique can be exploited for the fabrication of Si (amorphous, microcrystalline, and nanocrystalline) and SiO$_2$ thin films. The amorphous Si thin films fabricated by HD-PECVD technique show a significantly lower hydrogen content than films processed by standard PECVD techniques employing a CCP source. The HD-PECVD deposited microcrystalline Si thin films display a high film density and crystalline volume fraction. The SiO$_2$ thin films deposited/grown by high-density plasma-based processes show superior physical, electrical, and reliability characteristics, as compared to those deposited by low-density plasma based processes such as PECVD. The HD-PECVD deposited SiO$_x$ thin films show strong PL signal even in the as-deposited state. Additional details of the HD-PECVD processing of SiO$_2$, and SiO$_x$ layers are described below. The HD-PECVD deposited SiO$_x$ thin films can be doped to control the emission characteristics for optoelectronic applications, or formed in multilayered structures.

The high plasma energy and density associated with the HD-PECVD process are desired because the process enhances the plasma reaction kinetics and extends the range of reaction possibilities in the plasma, as compared to standard physical and chemical processing techniques. The high-density PECVD technique is suitable for the high quality thin films with minimal process-induced bulk and interface damage, as compared to sputtering or conventional PECVD technique employing capacitively-coupled plasma source. The high-density plasma process is also attractive for the low temperature processing of thin films, as the reaction kinetics are dominantly controlled by the plasma parameters rather than the thermal state of the substrate.

SiO$_2$ Thin Films

High quality SiO$_2$ thin films are required for the efficient shielding of emitted light, to prevent absorption by adjacent Si layers. The SiO$_2$ thin films fabricated by the HD-PECVD technique have shown superior microstructural, optical, electrical, and reliability characteristics, as compared to films deposited by standard PECVD and sputtering techniques. For example, the refractive index of the HD-PECVD processed films is comparable the high film density associated with thermal oxide processes. The electrical quality of the films is superior to those processed by sputtering and standard PECVD techniques; as evaluated in terms of the leakage current, capacitance-voltage, and electrical breakdown field strength characteristics. The HD-PECVD deposited films show superior interfacial and reliability characteristics as evaluated in terms of the bias-temperature stress effects on the electrical properties. The high-density PECVD processing range is listed in Table I. The structural, optical, and electrical characteristics of the HD-PECVD processed films show that the high plasma density and low plasma potential of the high-density plasma process are effective in minimizing the bulk and interface damage, and any process-induced impurities in the deposited films, even at low processing temperatures.

Silane and Oxygen Source Gas Only

High density plasma is effective in the generation of nc-Si particles emitting the PL in the wavelength range of 400-900 nm, suitable for PL/EL based electronic applications. Some high density plasma characteristics, such as high plasma density, low plasma potential, and independent control of plasma energy and density, are effective in depositing high quality nc-Si embedded SiOx thin films for novel optoelectronic applications. The observed PL/EL characteristics at low process pressure are responsive to plasma and substrate surface reaction kinetics, rather than the sheath voltage. The sheath voltage (the voltage potential between top and bottom electrodes) associated with the present invention high density plasma is very low, typically less than 20 V, as compared to other conventional plasmas (with typical values exceeding 100V). This low sheath voltages minimizes plasma bombardment-induced damage to the deposited films. The nc particle size and density can be controlled, and exert a considerable influence over PL emissions in the wavelength range of 400-900 nm. However, the particle size and density control has less effect at wavelengths exceeding 600 nm, unless $H_2$, $N_2$, or noble inert gases are introduced into the process.

TABLE I

| High density plasma Silane and oxygen source gas | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Gases: general | Any suitable precursor for Si + Source of Oxygen: $O_2$, $N_2O$ |
| Exemplary Gases | $SiH_4 + N_2O$ |
| Temperature | 25-400° C. |
| Film Thickness (nm) | 5 nm-1 µm |

Silane and Oxygen Source Gas with Inert Gases

Approach 1—the use of $N_2$: The Si nanocrystal embedded $SiO_x$ thin films can be prepared with a HD-PECVD technique that uses a combination of the $SiH_4$, $N_2O$, and $N_2$ precursors. As used herein, a "nanocrystal" is a particle with a size that is controlled to be in the range of about 1 to 8 nm. The $SiO_x$ thin film properties are controlled by varying the gas flow rate and ratios, RF power, system pressure, and substrate temperature. The deposition process can be optimized for optical and PL emission characteristics. Some details of the HD-PECVD processing range are listed in Table II.

TABLE II

| High density plasma processing of $SiO_x$ thin films | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Gases: general | Any suitable precursor for Si + Source of Oxygen: $O_2$, $N_2O$ + Inert Gas |
| Gases: Exemplary Process | $SiH_4 + N_2O + N_2$ |
| Temperature | 25-400° C. |
| Film Thickness (nm) | 5 nm-1 µm |

Figure 4A:
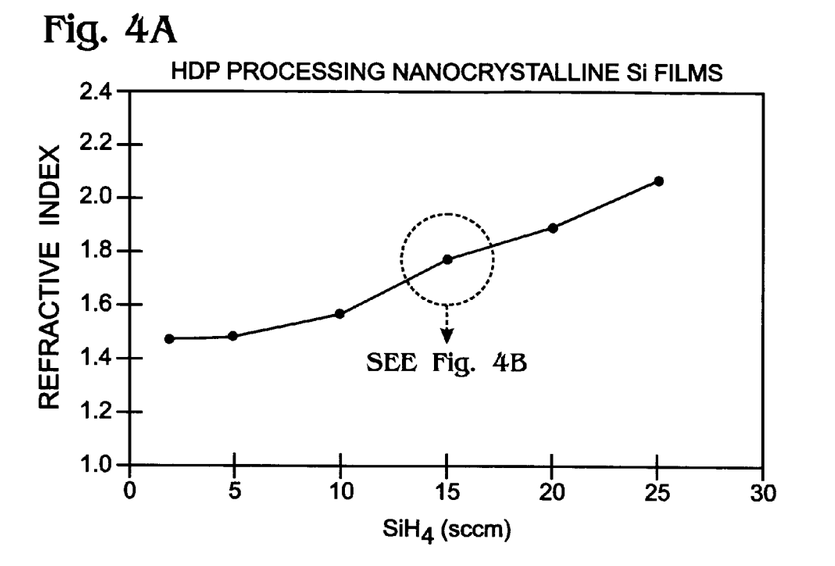
FIGS. 4A and 4B are graphs depicting the effect of silane flow rate on the refractive index and the PL characteristics, respectively, of nanocrystalline Si-embedded $SiO_x$ thin films.
Figure 4B:
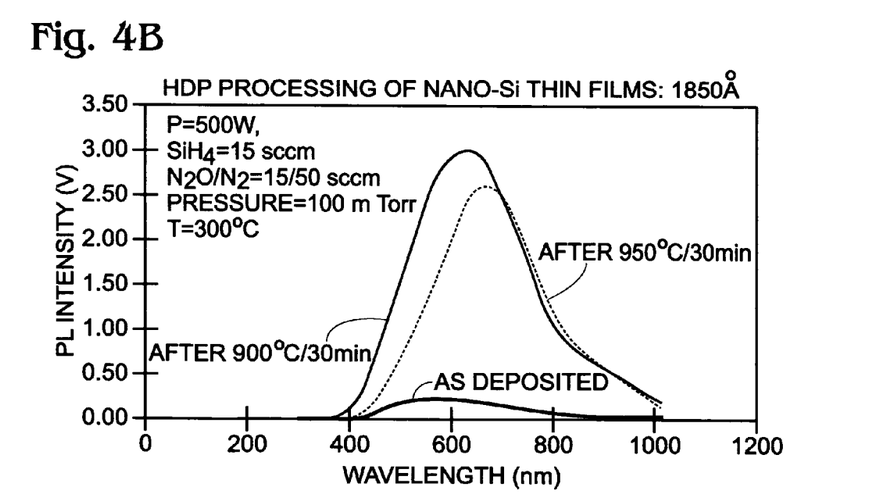

FIGS. 4A and 4B are graphs depicting the effect of silane flow rate on the refractive index and the PL characteristics, respectively, of nanocrystalline Si-embedded $SiO_x$ thin films. The HD-PECVD process is effective in controlling the optical characteristics of the $SiO_x$ thin films over a wide range by varying the processing conditions. It is possible to increase the refractive index (n) of the $SiO_x$ thin films by increasing the $SiH_4/N_2O$ gas ratio, while keeping the RF power constant, which indicates the formation of Si nanocrystals in the $SiO_x$ matrix. A change in the refractive index value is indicative of a change in the Si nanocrystal size, which in turn, has an effect upon the emission characteristics of the $SiO_x$ thin films. FIG. 4B depicts the PL characteristics of a $SiO_x$ thin film with a refractive index value of 1.77. The film was deposited at an RF power of 500 W, a system pressure of 100 mTorr, and a $SiH_4/N_2O/N_2$ ratio of 15/15/50.

Figure 5A:
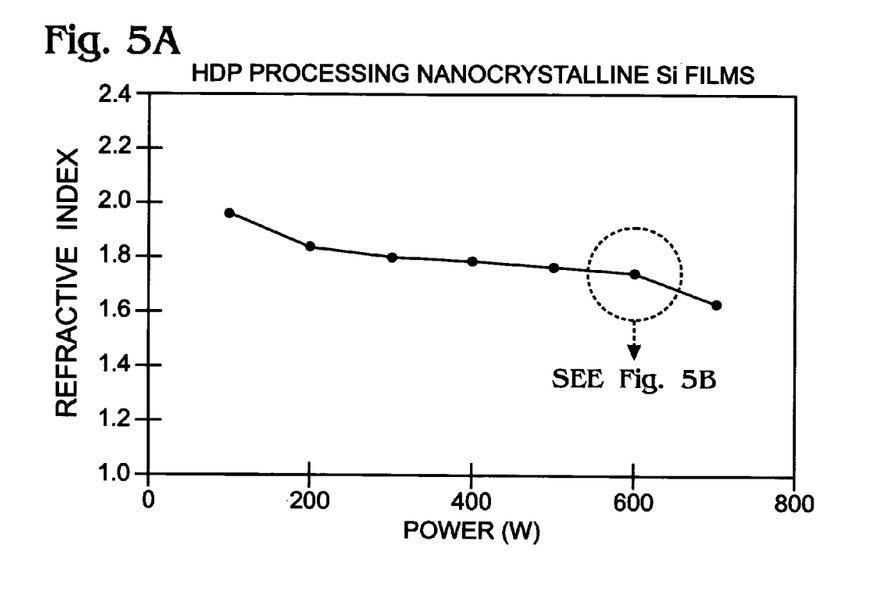
FIGS. 5A and 5B are graphs depicting the effect of RF power upon the refractive index and the PL characteristics, respectively, of nanocrystalline Si-embedded $SiO_x$ thin films.
Figure 5B:
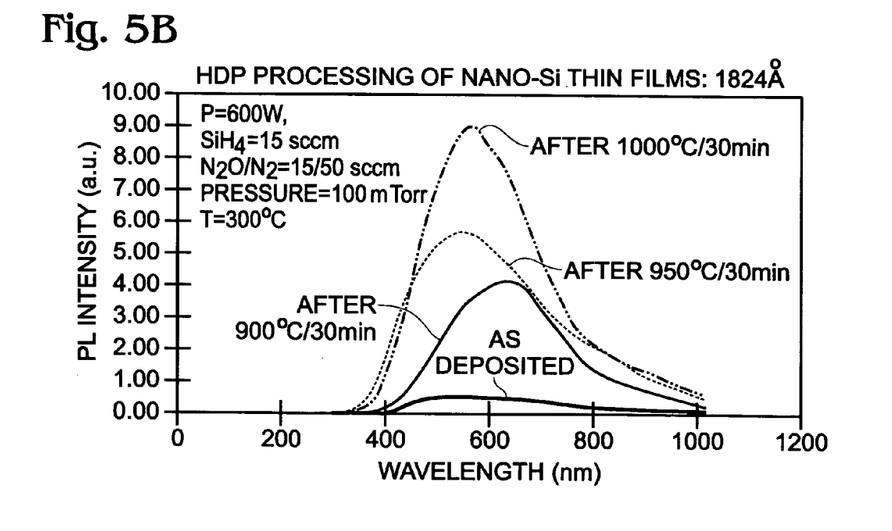

FIGS. 5A and 5B are graphs depicting the effect of RF power upon the refractive index and the PL characteristics, respectively, of nanocrystalline Si-embedded $SiO_x$ thin films. The RF power is also effective in controlling the refractive index and the PL characteristics. Using variations in the RF power, it is possible to control the refractive index and the corresponding PL characteristics over a wide range. The HD-PECVD deposited $SiO_x$ thin-films exhibit appreciable PL signal even in the as-deposited state. The PL characteristics can be significantly enhanced by performing a post-deposition thermal annealing treatment.

Generally, the addition of $N_2$ gas in the plasma leads to enhanced reaction kinetics and better control of nc-Si particle sizes and density. The nitrogen gas addition leads to efficient breakdown of the silane and the oxygen source gas by the active nitrogen species generated in the high density plasma at pressures lower than 500 mTorr. The present invention high density plasma process, using a high plasma density and low plasma potential, at process pressures lower than 500 mTorr, is more efficient than conventional plasmas. The enhanced reaction kinetics due to the addition of nitrogen gas leads to increased particle density and size control (when compared to the use of just silane and an oxygen-source gas), especially, at wavelengths shorter than 600 nm.

Approach 2—The use of silane, an oxygen source gas, and a Noble insert gas: The first approach (above) demonstrates that high-quality microcrystalline Si thin-films with high crystalline volume fraction and large grain sizes can be fabricated using a HD-PECVD technique. The second approach demonstrates that high-density plasma-generated active hydrogen species are effective in inducing crystallization in the deposited thin films, even at film thicknesses of less than 500 Å. In one aspect, an HD-PECVD process is used to fabricate nanocrystalline Si-embedded $SiO_x$ thin films by using, for example, a combination of silane, $N_2O$, and $H_2$. Some details of the processing conditions are listed in Table III. The combination of high-density plasma-generated active hydrogen and oxygen species is effective in the creation of Si nanocrystals in a growing $SiO_x$ matrix. It is possible to tune the optical characteristics of the $SiO_x$ thin films over a wide range by varying the gas flow rates and ratios, applied power, and substrate temperature.

Figure 6A:
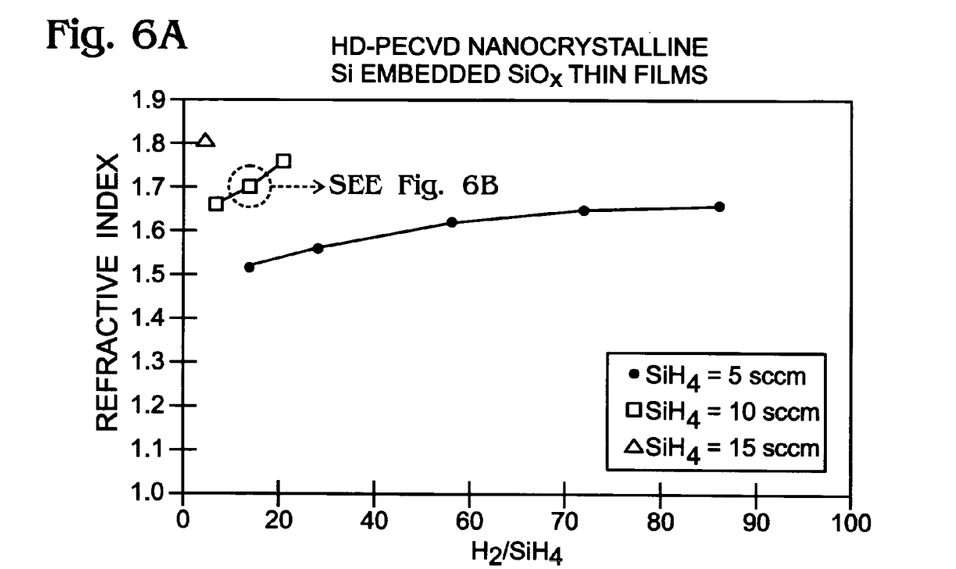
FIG. 6A is a graph depicting the effect of the $H_2/SiH_4$ ratio on the refractive index.
Figure 6B:
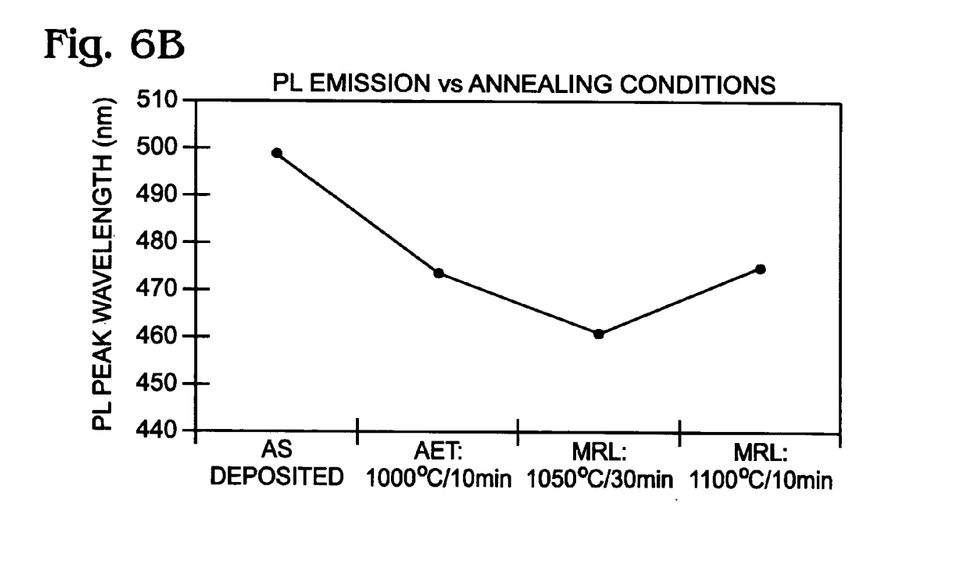
FIG. 6B is a graph depicting the effect of a post-deposition thermal annealing treatment on the PL characteristics of $SiO_x$ thin-films.

FIG. 6A is a graph depicting the effect of the $H_2/SiH_4$ ratio on the refractive index. FIG. 6B is a graph depicting the effect of a post-deposition thermal annealing treatment on the PL characteristics of $SiO_x$ thin-films. FIG. 6A shows the effect of the $SiH_4$ flow rate and the $H_2/SiH_4$ ratio on the refractive index of $SiO_x$ thin films. The PL spectrum of an exemplary film deposited at a SiH4/N2O/H2 ratio of 10/15/100 is shown in FIG. 6B. The as-deposited films show a strong PL signal, which is significantly enhanced by the post-deposition thermal annealing treatment. It is possible to vary the refractive index and the PL wavelength by varying the processing conditions over a wide range, showing the effectiveness of the high-density plasma in the creation of Si nanocrystals with controlled size and distribution over a wide range, suitable for the fabrication of novel electronic devices.

Generally, the present invention high density plasma process is efficient in the creation of active hydrogen species for the generation and control of the nc-Si particle (size and density). The plasma-generated hydrogen species are also influential for inducing crystallinity in the generated nc-Si particles. Hydrogen plasma can minimize the amorphous phase by efficient etching of the generated Si nano-particles. Additionally, hydrogen bombardment can efficiently break silane in the plasma for the generation and control of the nano-particles. The addition of hydrogen has been effective in lowering the grain growth temperature in microcrystalline silicon films. The HDP-generated hydrogen species can further enhance the optical performance of nc-Si embedded SiOx thin films by in-situ passivation of the defective bonds. The defective bonds often lead to a decreased PL/EL response due to absorption and non-radiative recombination processes. The hydrogen plasma addition is specifically effective for the creation of nc-Si particles emitting PL signal at wavelengths exceeding 600 nm. The increased particle density and sizes by active hydrogen species in the high density plasma lead to enhanced PL performance at wavelengths in the range of 400-900 nm.

TABLE III

High density plasma using $H_2$

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Gases: general | Any suitable precursor for Si + Source of Oxygen: $O_2$, $N_2O$ + Noble Gas (He, Ar, Kr, etc.) |
| Exemplary Gases | $SiH_4$ + $N_2O$ + $H_2$ |
| Temperature | 25-400° C. |
| Film Thickness (nm) | 5 nm-1 μm |

Approach 3—Noble Gases other than H2: The high density plasma process is effective in the development of novel thin films due to high concentration of plasma generated active radicals and ionized species—leading to extended reaction possibilities in the plasma, as compared to the plasma generated by conventional plasma sources. The high density plasma generated metastable species can effectively transfer their energy to the reactive precursor and gases leading to enhanced reaction kinetics in the plasma and on the substrate surface. The noble gases are suitable for the creation of metastables in the high density plasma when using a low plasma potential and low process pressures. A conventional plasma process is not suitable for the generation of radicals and ions by addition of noble gases, due to low plasma density and high sheath voltages. The high sheath voltages generate inefficient reaction kinetics and high thin film bombardment by the plasma generated species, which results in a low quality thin films. The addition of the inert gases in the high density plasma significantly enhances the nc-Si particle generation and control. This is due to the high energy of the metastable atoms of the noble gases. For example, among the following three noble inert gases: He, Ar, and Kr; He is the most suitable gas in terms of enhancing radical concentration in the plasma and minimizing plasma-induced film damage, which is critical for device performance. The first metastable energy states of He, Ar, and Kr are 19.8 eV, 11.6 eV, and 9.9 eV, respectively. So the inert gas atoms can generate active radicals and ions by energy transfer enabling the development of novel thin films.

Another aspect to consider is the plasma-induced damage to the growing film, which directly affects the performance and reliability of thin films. When selecting a gas among the various noble gases, He gas is the most suitable for minimizing plasma-induced damage to the growing film, as it is lightest among the various inert gases under consideration. At the same time, the He metastables have the highest energy desired, which is desirable for enhanced reaction kinetics by energy transfer. So He is expected to be most effective in the generation of active radicals and ions by energy transfer.

It has previously been demonstrated that thermal quality oxide thin films can be grown on Si by active oxygen radicals, generated in high density $He/O_2$ plasma at temperatures lower than 400° C. The addition of noble inert gases to the high density plasma is effective in the creation of nc-Si particles emitting PL signals at wavelengths exceeding 600 nm. The use of inert metastable atoms promotes increased nanocrystalline Si particle density and sizes using active species generated in the high density plasma.

TABLE IV

High density plasma using Noble Insert Gases

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Gases: general | Any suitable precursor for Si + Source of Oxygen: $O_2$, $N_2O$ + Noble Gas (He, Ar, Kr, etc.) |
| Exemplary Gases (1) | $SiH_4$ + $N_2O$ + He, Kr |
| Exemplary Gases (2) | $SiH_4$ + $N_2O$ + $H_2$ + Noble Gas |
| Exemplary Gases (3) | $SiH_4$ + $N_2O$ + $H_2$ + He, Kr |
| Temperature | 25-400° C. |
| Film Thickness (nm) | 5 nm-1 μm |

Approach 4—Processes with N2 and/or other inert gases: Processes involving N2 and the oxygen source gas are very efficient in generating nc-Si particles emitting wavelengths in the range of 400-900 nm. While the high density plasma is more effective the generation of small nc-Si particle suitable for efficient light emission at shorter wavelengths (<700 nm), it is possible to generate larger particles for emitting PL at wavelengths exceeding 700 nm. However, the PL response can be improved when $H_2$ or other Noble inert gases are added to the processes. The $H_2$ gas can induce crystallinity in the generated nc-Si particles, while noble gas atoms can enhance particle sizes and density by generating active radicals and ions in the plasma by metastable energy transfer. The efficiency of the $N_2$ based processes can be enhanced by introducing an inert gas in the high density plasma with metastable energy suitable for generating excited nitrogen radicals and/or ions in the plasma for enhanced reaction kinetics. The high density plasma is the most suitable medium for the generation of active radicals by metastable energy transfer due to low process pressures, high plasma density, low plasma potential, and independent control of plasma energy and density. Thus, compared to just silane and an oxygen-source gas, the additional use of N2 and an inert gas generally results in both a greater number of nc-Si particles, and nc-Si particles of greater size.

TABLE V $N_2$ and inert gases

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Gases: general | Any suitable precursor for Si + Source of Oxygen: $O_2$, $N_2O$ + Inert Gas ($N_2$ or any non-noble inert gas) |
| Our Investigation | $SiH_4$ + $N_2O$ + $N_2$ |
| Potential Process | $SiH_4$ + $N_2O$ + $N_2$ + Noble Gas (He, Ar, Kr, etc.) |
| Temperature | 25-400° C. |
| Film Thickness (nm) | 5 nm-1 μm |

Hydrogenation

The interfacial and the bulk quality of the $SiO_2$ and the nanocrystalline Si embedded $SiO_x$ thin films are important for the fabrication of stable and reliable electronic devices. The high-density plasma characteristics are suitable for the fabrication of high quality thin-films with high structural density, low process-induced impurity content, and minimal bulk or interface damage. In general, the bulk and interface defect concentration of Si, $SiO_x$, and $SiO_2$ thin films can be further reduced by hydrogen passivation of the defect sites for the fabrication of advanced optoelectronic devices with high quantum efficiency. The films can be hydrogenated by thermal and plasma methods. The films can be hydrogenated by thermal annealing in a $N_2/H_2$ atmosphere at any suitable annealing temperature. The thermal hydrogenation process typically requires a high thermal budget due to low diffusion coefficients of molecular hydrogen species at thermal energies.

The high-density plasma hydrogenation process is attractive for an efficient low temperature and low thermal budget passivation of defects and dangling bonds in the deposited Si, $SiO_x$, and $SiO_2$ thin films. High-density plasma-generated active hydrogen species are suitable for the efficient hydrogenation of thick films and novel multilayer structures. Table IV summarizes the high-density plasma processing conditions suitable for the efficient hydrogenation of thin films. Details of such a process are provided in a pending patent application entitled, HIGH-DENSITY PLASMA HYDROGENATION, invented by Pooran Joshi et al., Ser. No. 11/013,605, filed Dec. 15, 2004, which is incorporated herein by reference.

TABLE VI

High density plasma hydrogenation process range

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Gases: General | $H_2$ + Any suitable Inert Gas |
| Exemplary Gases | $H_2$ |
| Temperature | 25-400° C. |
| Time | 30 s-60 min |

Thermal Treatment and PL Emission

The films shown in FIGS. 4B, 5B, and 6B demonstrate the PL characteristics of a $SiO_x$ thin film deposited at a substrate temperature of 310° C. The presence of a strong signal in the as-deposited films shows the potential of the HDP process in creating Si nanocrystals, even at temperatures lower than 400° C. The PL emission characteristics of the $SiO_x$ thin films can be further enhanced by a high-temperature thermal treatment in a suitable ambient. The high-temperature annealing results in a separation of the $SiO_x$ phase into Si clusters or nanocrystals, separated by a matrix of $SiO_2$. The annealing temperature and time can be varied with the thin-film deposition process conditions and properties, so that the Si cluster size, concentration, and distribution are suitable for the fabrication of efficient PL/EL devices. Some exemplary annealing conditions are listed in Table V.

TABLE VII

Typical post-deposition thermal annealing range for $SiO_x$ thin films with embedded Si nanocrystals.

| | |
|---|---|
| Temperature Range | >600° C. |
| Time | 10-60 min |
| Ambient | Inert gas/Oxygen |

Figure 7:
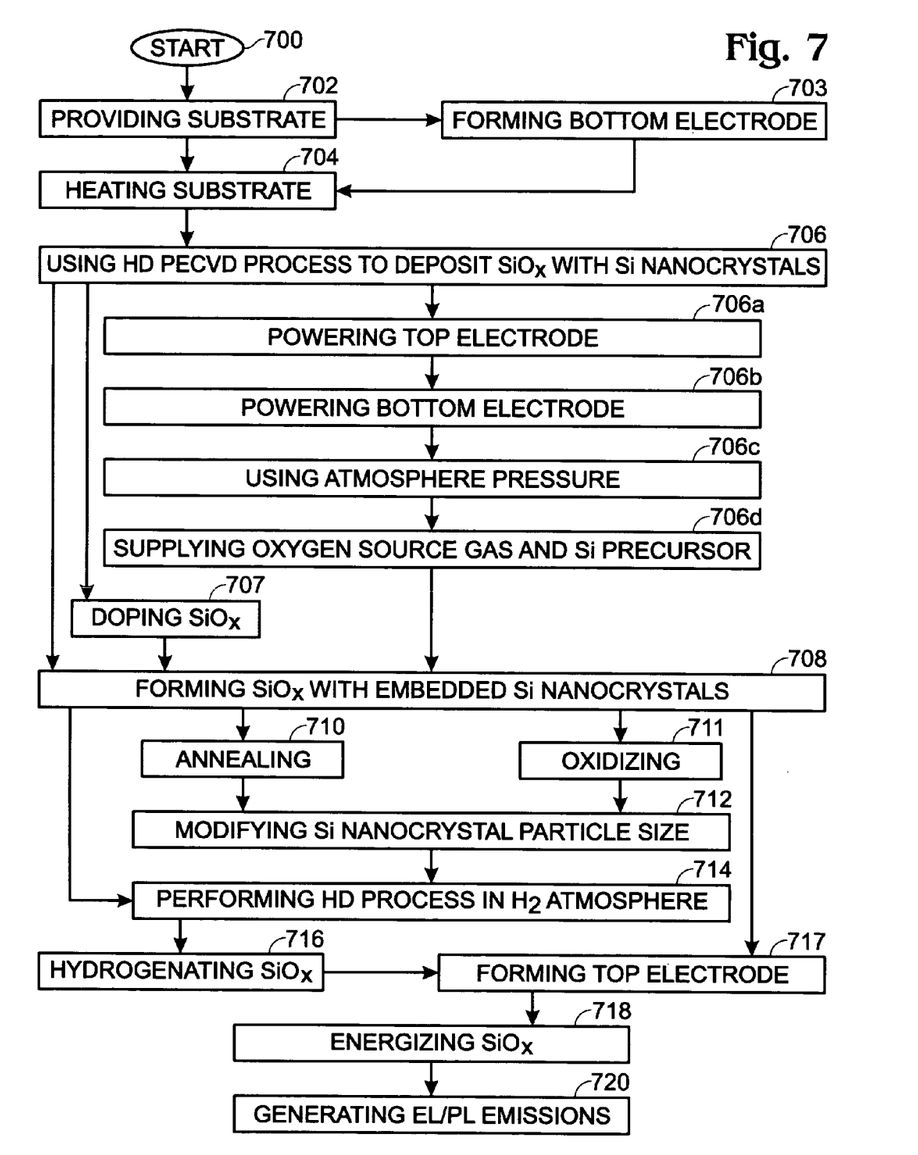
FIG. 7 is a flowchart illustrating a method for forming a silicon oxide (SiOx) thin-film with embedded nanocrystalline Si.

FIG. 7 is a flowchart illustrating a method for forming a silicon oxide (SiOx) thin-film with embedded nanocrystalline Si. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 700.

Step 702 provides a substrate. For example, the substrate can be plastic, glass, quartz, ceramic, metal, polymer, undoped Si, doped Si, SiC, Ge, $Si_{1-x}Ge_x$, silicon-containing materials, or other semiconductor materials. Step 704 heats the substrate to a temperature of less than about 400° C. Step 706 deposits SiOx, where x is in the range of 1 to 2, overlying the substrate, using a HD PECVD process. In one optional variation, Step 707 dopes the SiOx thin-film with a dopant such as a Type 3, Type 4, Type 5, or rare earth element. Step 708 forms a SiOx thin-film embedded with nanocrystalline Si. For example, the SiOx thin-film may have an extinction coefficient in the range of about 0 to 0.5.

In one aspect, depositing the SiOx in Step 706 includes using an inductively coupled plasma (ICP) source. In another aspect, Step 706 uses a source such as a microwave slot antenna, a hollow cathode, an electron cyclotron resonance (ECR) plasma source, or a cathode-coupled plasma source. In another aspect, Step 706 deposits SiOx using a plasma concentration of greater than $1\times10^{11}$ cm$^{-3}$, with an electron temperature of less than 10 eV.

More specifically, Step 706 may include substeps to deposit SiOx using an ICP source. Step 706a supplies power to a top electrode at a frequency in the range of 13.56 to 300 megahertz (MHz), and a power density of up to 10 watts per square centimeter (W/cm$^2$). Step 706b supplies power to a bottom electrode at a frequency in the range of 50 kilohertz to 13.56 MHz, and a power density of up to 3 W/cm$^2$. Step 706c uses an atmosphere pressure in the range of 1 to 500 mTorr, and Step 706d supplies an oxygen source gas and a silicon precursor.

Some examples of a silicon precursor include $Si_2H_6$, dichlorosilane, TEOS (tetra-ethoxy ortho-silicate), and $SiH_4$. Examples of an oxygen source include $N_2O$, NO, $O_2$, and $O_3$, and the ratio of a silane silicon precursor to oxygen source gas may be in the range of about 0.1 to 10.

In another aspect, supplying the oxygen source gas and silicon precursor in Step 706d further includes supplying a hydrogen source gas. In a different aspect, Step 706d supplies an oxygen source gas, silicon precursor, hydrogen source gas, and an inert gas such as $N_2$, He, Ar, or Kr. For example, the oxygen source gas and inert gas may be in a ratio in the range of about 0.02 to 5, the ratio of oxygen source gas to hydrogen gas may be in a ratio in the range of about 0.01 to 20, and the ratio of inert gas to hydrogen gas may be in a ratio in the range of about 0.01 to 40. In a different example, $NH_3$ is supplied, acting as both the hydrogen source gas and inert gas.

In one aspect, forming the SiOx thin-film in Step 708 may include increasing a refractive index of the SiOx thin-film in response to increasing the ratio of hydrogen to silicon precursor.

In a different aspect, supplying the oxygen source gas and silicon precursor in Step 706d further includes supplying a nitrogen source gas, such as $N_2$ or $NH_3$, where the ratio of nitrogen source gas to silicon precursor in the range of about 0.01 to 20.

In yet another aspect, supplying the oxygen source gas and silicon precursor in Step 706d may further include supplying a noble gas, where the ratio of noble gas to silicon precursor in the range of about 0.02 to 10. Then, forming the SiOx thin-film with embedded nanocrystalline Si in Step 708 includes increasing a refractive index of the SiOx thin film in response to increasing the ratio of noble gas to silicon precursor. In one aspect, the noble gas is He, where the ratio of He gas to silicon precursor in the range of about 0.02 to 100.

The high-density plasma is efficient in the generation of active radical and ionized species. The metastables of inert gas atoms, generated in the plasma, have high energy, depending on the nature of the inert gas and the partial pressure of various precursor and gases. The high energy is transferred to the reactive species in the plasma for enhanced reaction kinetics in the fabrication of high quality thin films. For example, the metastables of inert gas like He can effectively generate radicals or ions by energy transfer in the plasma to promote the creation and control of the particle size which, in turn, control the emitted wavelength when excited by optical or electrical signal. At the same time, the low plasma potential of the high density plasma technique minimizes any plasma induced bulk or interface damage, which is critical for the fabrication of high performance electronic devices.

If Step 706a decreases the RF power to the top electrode, then forming the SiOx thin-film in Step 708 includes increasing the refractive index of the SiOx thin-film in response to decreasing the RF power. Likewise, if Step 706d increases the ratio of silicon precursor to oxygen source gas, then Step 708 increases the SiOx thin-film refractive index in response to increasing the silicon precursor/oxygen source gas ratio. Generally, process variations can be used to form a SiOx thin-film with embedded nanocrystalline Si having a refractive index in the range of about 1.6 to 2.2.

In one aspect the method comprises a further step. Step 710, following the formation of the SiOx thin-film in Step 708, anneals as follows: heating the substrate to a temperature of greater than about 400° C.; heating for a time duration in the range of about 10 to 300 minutes; and, heating in an atmosphere including oxygen and insert gases. Then, Step 712 modifies the size of nanocrystalline Si particles in the SiOx thin-film in response to the annealing. For example, the annealing can be accomplished using a heat source having a radiation wavelength of about 200 to 600 nanometers (nm) or 9 to 11 micrometers. In one aspect, both wavelength ranges are used simultaneously.

Alternately, or in addition to Step 710, Step 711 oxidizes the SiOx thin-film using a process such as plasma or thermal oxidation, following the formation of the SiOx thin-film in Step 708. Then, Step 712 modifies the size of nanocrystalline Si particles in the SiOx thin-film in response to the oxidation process.

In another aspect, Step 714 performs a HD plasma treatment of the SiOx thin-film in an $H_2$ atmosphere, using a substrate temperature of less than 400° C. Step 716 hydrogenates the SiOx thin-film.

In one aspect, the method describes the formation of a photoluminescence (PL) device using a SiOx thin-film with embedded nanocrystalline Si. In this aspect, Step 703 forms a metal bottom electrode, Step 706 deposits SiOx using the HD-PECVD process, as described above, and Step 708 forms an SiOx thin-film embedded with nanocrystalline Si overlying the bottom electrode. Step 717 forms a metal top electrode overlying the SiOx thin-film. Step 718 energizes the SiOx thin-film, in response to applying a voltage potential to the top and bottom electrodes. Step 720 generates electroluminescence (EL) and PL emissions in the range of about 450 to 900 nanometers (nm).

A high-density PECVD method has been provided for the deposition of SiOx thin-films with embedded Si nanocrystals. Some details of specific materials and fabrication steps have been used to illustrate the invention. However, the invention is not limited to merely these examples. Other variations and embodiments of the invention will occur to those skilled in the art.

We claim:

1. A method for forming a silicon oxide (SiOx) thin-film with embedded nanocrystalline silicon (Si), the method comprising:
   providing a substrate;
   depositing SiOx, where x is in the range of 1 to 2, overlying the substrate, using an inductively coupled plasma (ICP) high density (HD) plasma-enhanced chemical vapor deposition (PECVD) process as follows:
      supplying power to a top electrode at a frequency in the range of 13.56 to 300 megahertz (MHz), and a power density of up to 10 watts per square centimeter (W/cm$^2$);
      supplying power to a bottom electrode at a frequency in the range of 50 kilohertz to 13.56 MHz, and a power density of up to 3 W/cm$^2$;
      using an atmosphere pressure in the range of 1 to 500 mTorr;
      supplying an oxygen source gas and a silicon precursor; and,
   forming an SiOx thin-film embedded with nanocrystalline Si.

2. The method of claim 1 further comprising:
   heating the substrate to a temperature of less than about 400° C.

3. The method of claim 1 wherein supplying the oxygen source gas includes supplying an oxygen source gas from a source selected from a group consisting of N2O, NO, O2, and O3.

4. The method of claim 3 wherein supplying the oxygen source gas and silicon precursor further includes supplying a hydrogen source gas.

5. The method of claim 4 wherein supplying the oxygen source gas, silicon precursor, and hydrogen source gas further includes supplying an inert gas selected from a group consisting of N2, He, Ar, and Kr.

6. The method of claim 5 wherein supplying the hydrogen source gas and inert gas includes supplying NH3.

7. The method of claim 5 wherein supplying the oxygen source gas, silicon precursor, hydrogen gas, and inert gas includes supplying the oxygen source gas and inert gas in a ratio in the range of about 0.02 to 5.

8. The method of claim 5 wherein supplying the oxygen source gas, silicon precursor, hydrogen source gas, and inert gas includes supplying the oxygen source gas and hydrogen gas in a ratio in the range of about 0.01 to 20.

9. The method of claim 5 wherein supplying the oxygen source gas, silicon precursor, hydrogen source gas, and inert gas includes supplying inert gas and hydrogen gas in a ratio in the range of about 0.01 to 40.

10. The method of claim 4 wherein forming the SiOx thin-film with embedded nanocrystalline Si includes increasing a refractive index of the SiOx thin-film in response to increasing the ratio of hydrogen to silicon precursor.

11. The method of claim 1 wherein supplying the oxygen source gas and silicon precursor includes supplying a ratio of silane to oxygen source gas in the range of about 0.1 to 10.

12. The method of claim 1 supplying the oxygen source gas and silicon precursor further includes supplying a nitrogen source gas, selected from a group consisting of N2 and NH3, where the ratio of nitrogen source gas to silicon precursor in the range of about 0.01 to 20.

13. The method of claim 1 supplying the oxygen source gas and silicon precursor further includes supplying a noble gas, where the ratio of noble gas to silicon precursor in the range of about 0.02 to 10.

14. The method of claim 13 wherein supplying the noble gas includes increasing the ratio of noble gas to silicon precursor; and, wherein forming the SiOx thin-film with embedded nanocrystalline Si includes increasing a refractive index of the SiOx thin film in response to increasing the ratio of noble gas to silicon precursor.

15. The method of claim 1 supplying the oxygen source gas and silicon precursor further includes supplying a He gas, where the ratio of He gas to silicon precursor in the range of about 0.02 to 100.

16. The method of claim 1 wherein supplying the oxygen source gas and the silicon precursor includes supplying a silicon precursor selected from a group consisting of Si2H6, dichlorosilane, TEOS (tetra-ethoxy ortho-silicate), and SiH4.

17. The method of claim 1 wherein supplying power to the top electrode includes decreasing the RF power to the top electrode; and, wherein forming the SiOx thin-film with embedded nanocrystalline Si includes increasing a refractive index of the SiOx thin-film in response to decreasing the RF power.

18. The method of claim 1 wherein supplying the oxygen source gas and the silicon precursor includes increasing the ratio of silicon precursor to oxygen source gas; and, wherein forming the SiOx thin-film with embedded nanocrystalline Si includes increasing a refractive index of the SiOx thin-film in response to increasing the silicon precursor/oxygen source gas ratio.

19. The method of claim 1 wherein forming the SiOx thin-film with embedded nanocrystalline Si includes forming SiOx with a refractive index in the range of about 1.6 to 2.2.

20. The method of claim 1 further comprising:
following the formation of the SiOx thin-film, annealing as follows:
heating the substrate to a temperature of greater than about 40020 C.;
heating for a time duration in the range of about 10 to 300 minutes;
heating in an atmosphere including oxygen and insert gases; and,
modifying the size of nanocrystalline Si particles in the SiOx thin-film in response to the annealing.

21. The method of claim 1 further comprising:
following the formation of the SiOx thin-film, annealing using a heat source having a radiation wavelength selected from a group consisting of about 200 to 600 nanometers (nm) and 9 to 11 micrometers.

22. The method of claim 1 further comprising:
performing a HD plasma treatment of the SiOx thin-film in an $H_2$ atmosphere, using a substrate temperature of less than 400° C.; and,
hydrogenating the SiOx thin-film.

23. The method of claim 1 wherein forming the substrate includes forming a substrate from a material selected from a group consisting of plastic, glass, quartz, ceramic, metal, polymer, undoped Si, doped Si, SiC, Ge, $Si_{1-x}Ge_x$, silicon-containing materials, and semiconductor materials.

24. The method of claim 1 further comprising:
doping the SiOx thin-film with a dopant selected from a group consisting of Type 3, Type 4, Type 5, and rare earth elements.

25. The method of claim 1 further comprising:
following the formation of the SiOx thin-film, oxidizing the SiOx thin-film using a process selected from a group consisting of plasma and thermal oxidation; and,
modifying the size of nanocrystalline Si particles in the SiOx thin-film in response to the oxidation process.

26. The method of claim 1 wherein depositing SiOx using the HD PECVD process includes using a plasma concentration of greater than $1 \times 10^{11}$ $cm^{-3}$, with an electron temperature of less than 10 eV.

27. The method of claim 1 wherein forming the SiOx thin-film with embedded nanocrystalline Si includes forming SiOx with an extinction coefficient in the range of 0 to 0.5.

28. A method for forming a photoluminescence (PL) device using a silicon oxide (SiOx) thin-film with embedded nanocrystalline silicon (Si), the method comprising:
providing a substrate;
forming a bottom electrode;
depositing SiOx, where x is in the range of 1 to 2, using a high density (HD) plasma-enhanced chemical vapor deposition (PECVD) process;
forming an SiOx thin-film embedded with nanocrystalline Si overlying the bottom electrode; and,
forming a top electrode overlying the SiOx thin-film.

29. The method of claim 28 further comprising:
in response to applying a voltage potential to the top and bottom electrodes, energizing the SiOx thin-film; and,
generating electroluminescence (EL) emissions in the range of about 450 to 900 nanometers (nm).

30. A method for forming a silicon oxide (SiOx) thin-film with embedded nanocrystalline silicon (Si), the method comprising:
providing a substrate;
depositing SiOx, where x is in the range of 1 to 2, overlying the substrate, using a high density (HD) plasma-enhanced chemical vapor deposition (PECVD) process;
forming an SiOx thin-film embedded with nanocrystalline Si;
performing a HD plasma treatment of the SiOx thin-film in an $H_2$ atmosphere, using a substrate temperature of Less than 400° C.; and,
hydrogenating the SiOx thin-film.

31. A method for forming a silicon oxide (SiOx) thin-film with embedded nanocrystalline silicon (Si), the method comprising:
providing a substrate;
depositing SiOx, where x is in the range of 1 to 2, overlying the substrate, using a high density (HD) plasma-enhanced chemical vapor deposition (PECVD) process;
forming an SiOx thin-film embedded with nanocrystalline Si;
following the formation of the SiOx thin-film, oxidizing the SiOx thin-film using a process selected from a group consisting of plasma and thermal oxidation; and,
modifying the size of nanocrystalline Si particles in the SiOx thin-film in response to the oxidation process.

32. A method for forming a silicon oxide (SiOx) thin-film with embedded nanocrystalline silicon (Si), the method comprising:
providing a substrate;
depositing SiOx, where x is in the range of 1 to 2, overlying the substrate, using a high density (HD) plasma-enhanced chemical vapor deposition (PECVD) process with a plasma concentration of greater than $1 \times 10^{11}$ $cm^{-3}$, with an electron temperature of less than 10 eV; and,
forming an SiOx thin-film embedded with nanocrystalline Si.

33. A method for forming a silicon oxide (SiOx) thin-film with embedded nanocrystalline silicon (Si), the method comprising:

provided a substrate;

depositing SiOx, where x is in the range of 1 to 2, overlying the substrate, using a high density (HD) plasma-enhanced chemical vapor deposition (PECVD) process;

forming an SiOx thin-film embedded with nanocrystalline Si, with an extinction coefficient in the range of 0 to 0.5.

34. A method for forming a silicon oxide (SiOx) thin-film with embedded nanocrystalline silicon (Si), the method comprising:

providing a substrate;

depositing SiOx, where x is in the range of 1 to 2, overlying the substrate, using a high density (HD) plasma-enhanced chemical vapor deposition (PECVD) process;

forming an SiOx thin-film embedded with nanocrystalline Si; and, following the formation of the SiOx thin-film, annealing using a heat source having a radiation wavelength selected from a group consisting of about 200 to 600 nanometers (nm) and 9 to 11 micrometers.

* * * * *

UNITED STATES PATENT AND TRADEMARK OFFICE
CERTIFICATE OF CORRECTION

PATENT NO. : 7,544,625 B2  Page 1 of 1
APPLICATION NO. : 11/418273
DATED : June 9, 2009
INVENTOR(S) : Pooran Joshi et al.

It is certified that error appears in the above-identified patent and that said Letters Patent is hereby corrected as shown below:

In col. 15, line 36, there is an error in claim 20. The term "40020 C" is printed. The term should be "400° C".

Claim 20 should be printed as follows:

20. The method of claim 1 further comprising:
following the formation of the SiOx thin-film, annealing as follows:
heating the substrate to a temperature of greater than about 400° C;
heating for a time duration in the range of about 10 to 300 minutes;
heating in an atmosphere including oxygen and insert gases; and,
modifying the size of nanocrystalline Si particles in the SiOx thin-film in response to the annealing.

Signed and Sealed this

Eighteenth Day of August, 2009

David J. Kappos
*Director of the United States Patent and Trademark Office*